United States Patent [19]

Pricer

[11] Patent Number: 4,604,534
[45] Date of Patent: Aug. 5, 1986

[54] HIGHLY SENSITIVE HIGH PERFORMANCE SENSE AMPLIFIERS

[75] Inventor: Wilbur D. Pricer, Burlington, Vt.

[73] Assignee: International Business Machines Corporation, Armonk, N.Y.

[21] Appl. No.: 677,613

[22] Filed: Dec. 3, 1984

[51] Int. Cl.[4] .................... H03K 5/24; H03K 3/287; H03K 3/356; G11C 7/06
[52] U.S. Cl. .................... 307/530; 307/279; 307/291; 365/203; 365/205
[58] Field of Search ............... 307/530, 355, 362, 279, 307/291; 365/189, 203, 205, 208

[56] References Cited

U.S. PATENT DOCUMENTS

| | | | |
|---|---|---|---|
| 3,993,918 | 11/1976 | Sinclair | 307/279 |
| 4,144,590 | 3/1979 | Kitagawa et al. | 365/205 |
| 4,150,311 | 4/1979 | Matsuda et al. | 307/279 X |
| 4,286,178 | 8/1981 | Rao et al. | 365/205 X |
| 4,494,020 | 1/1985 | Konishi | 307/530 |
| 4,542,306 | 9/1985 | Ikeda | 307/279 X |

FOREIGN PATENT DOCUMENTS 23664  2/1980  Japan .................... 307/279

Primary Examiner—Larry N. Anagnos
Attorney, Agent, or Firm—Stephen J. Limanek

[57] ABSTRACT

An improved voltage sensing circuit is provided which includes a pair of cross-coupled bipolar transistors coupled to a pair of signal nodes, a pair of cross-coupled field effect transistors coupled to the same pair of signal nodes and means for activating the bipolar transistors during a first period of time and then activating the field effect transistors. The bipolar transistors are preferably NPN transistors and the field effect transistors are preferably P channel transistors. The circuit may be conveniently fabricated in complementary metal oxide semiconductor (CMOS) technology.

23 Claims, 10 Drawing Figures

HIGHLY SENSITIVE HIGH PERFORMANCE SENSE AMPLIFIERS

DESCRIPTION

1. Technical Field

This invention relates to integrated semiconductor circuits, such as the complementary metal oxide semiconductor (CMOS) type, and more particularly, to a sense amplifying circuit or system which is capable of resolving very small signals within a short period of time with minimal direct current power dissipation.

2. Background Art

Integrated semiconductor circuits, particularly memory circuits employing cells which include a storage capacitor and a single switch, have achieved high memory cell densities. One of the simplest circuits for providing small memory cells is described in commonly assigned U.S. Pat. No. 3,387,286, filed July 14, 1967, by R. H. Dennard. Each of these cells employs essentially only a storage capacitor and a field effect transistor (FET) acting as a switch to selectively connect the capacitor to a bit/sense line. In also commonly assigned U.S. Pat. Nos. 3,811,076 by W. M. Smith and 3,841,926 by R. H. Garnache and W. M. Smith, both filed Jan. 2, 1973, there is disclosed a one-device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

The generation of a reference or dummy cell voltage, for detection of a signal in a one-device memory array, having a value midway between the voltage values representing a stored binary digit "1" and a stored binary digit "0" by equalizing the "1" and "0" digit voltages prior to applying the equalized voltage to the dummy cell capacitor is taught in U.S. Pat. No. 3,940,747, filed Feb. 24, 1976, by C. K. Kuo et al.

In another commonly assigned U.S. Pat. No. 4,080,590, filed Mar. 31, 1976, by W. D. Pricer, there is disclosed a merged charge memory produced in a unipolar technology which is provided with very small capacitor cells, each of which includes substantially only a small storage capacitor having a bit/sense line which provides a very small signal connected to one terminal of the capacitor and a word line providing a coupling to the other terminal of the capacitor.

A simple amplifier latch which may be used to sense signals stored in the cells described in the hereinabove referenced patents is disclosed in U.S. Pat. No. 3,588,844, filed July 7, 1971, by A. O. Christensen.

In IBM Technical Disclosure Bulletin, Vol. 16, No. 6, November 1973, pp. 1973-1974, by J. C. Hsieh, and in IBM Technical Disclosure Bulletin, Vol. 24, No. 11A, April 1982, pp. 5474-5475, by L. G. Heller, output latchs are disclosed which include cross-coupled P channel FETs and cross-coupled N channel FETs for detecting memory cell signals.

IBM Technical Disclosure Bulletin, Vol. 14, No. 12, May 1972, pp. 3684-3685, by R. D. Lane, discloses a differential amplifier which includes cross-coupled P channel FETs and a current switch having bipolar transistors.

Similar double cross-coupled arrangements of FETs are found in commonly assigned U.S. Pat. No. 3,983,545, filed on June 30, 1974, by W. Cordaro with a voltage equalizing transistor.

A capacitive coupling arrangement between the output node of a latch and the control electrode of the latch for detecting small signals is shown in commonly assigned U.S. Pat. No. 4,039,861, filed Feb. 9, 1976, by L. G. Heller and D. P. Spampinato.

Precharging capacitors in an FET sense amplifier to detect small signals is taught in commonly assigned U.S. Pat. No. 3,764,906, filed Oct. 1, 1971, by L. G. Heller.

Merged transistor logic (MTL) or integrated injection ($I^2L$) bipolar transistor memory characteristics and advantages for designing dense cells are well known, as, e.g., disclosed in commonly assigned U.S. Pat. No. 4,346,458, filed on Aug. 12, 1980, by H. H. Berger and S. K. Wiedmann.

It should be noted that high cell density and high performance in memory systems are generally conflicting goals because high density circuits usually require long high capacitance bit lines on which are produced very weak data signals.

DISCLOSURE OF THE INVENTION

It is an object of this invention to provide an improved high performance sensing circuit or system that is more sensitive to low voltages or signals than sense amplifiers utilizing only field effect transistors or bipolar transistors, while dissipating a minimal amount of direct current power.

In accordance with the teachings of this invention an improved sensing circuit or system is provided which utilizes a pair of cross-coupled bipolar transistors coupled to a pair of signal nodes and a pair of cross-coupled field effect transistors coupled to the same pair of signal nodes. In operation, the bipolar transistors are activated to detect and amplify an incoming signal applied to the nodes and then the field effect transistors are activated to further amplify these amplified signals.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
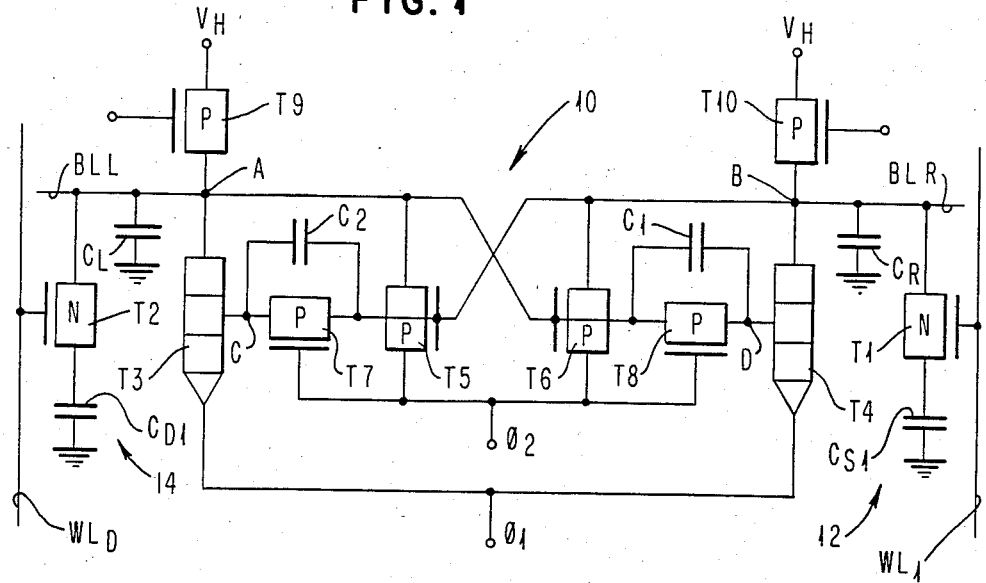
FIG. 1 illustrates one embodiment of the sensing circuit of the present invention.

Referring to FIG. 1 of the drawings in more detail, there is illustrated one embodiment of the sensing circuit of the present invention. The sensing circuit 10 includes first and second nodes A and B to which are connected, respectively, a bit line BLL located on the left side of the sensing circuit 10 and a bit line BLR located on the right side of the sensing circuit 10. The bit lines BLL and BLR may be portions of a memory array which also includes a first memory cell 12 having a storage capacitor $C_{S1}$ and a first field effect transistor T1 connected between the storage capacitor $C_{S1}$ and the right bit line BLR which is controlled by the voltage on a word line $WL_1$. The memory array also comprises means 14 for providing a reference voltage which includes a dummy cell capacitor $C_{D1}$, preferably having a capacitance one-half of that of the storage capacitor $C_{S1}$, and a second field effect transistor T2 connected between the dummy cell capacitor $C_{D1}$ and the left bit line BLL which is controlled by the voltage on a dummy word line $WL_D$. The left bit line BLL has a capacitance indicated by capacitor $C_L$ and the right bit line BLR has a capacitance indicated by capacitor $C_R$. Each of the capacitors $C_L$ and $C_R$ may have a capacitance of about 500 femtofarads.

The sensing circuit 10 further includes first and second bipolar transistors T3 and T4 connected at their collectors, respectively, to nodes A and B and at their emitters to a first clock terminal $\phi_1$. The base-collector and base-emitter capacitances of the transistors T3 and T4 may be about 20 femtofarads each. Node A is also connected to the base of the transistor T4 through a first coupling capacitor $C_1$ and node B is also connected to the base of the transistor T3 through a second coupling capacitor $C_2$ to form a cross-coupled bipolar transistor latch. Each of the coupling capacitors $C_1$ and $C_2$ may have a capacitance of 100 femtofarads. The sensing circuit 10 also includes third and fourth field effect transistors T5 and T6 connected at their drains, respectively, to nodes A and B and at their sources to a second clock terminal $\phi_2$. Node A is further connected to the control gate of the fourth transistor T6 and node B is further connected to the control gate of the third transistor T5 to form a cross-coupled field effect transistor latch. A coupling transistor T7 is connected between the control gate of transistor T5 and the base of transistor T3 and a coupling transistor T8 is connected between the control gate of transistor T6 and the base of transistor T4, with the control gates of transistors T7 and T8 being connected to the second clock terminal $\phi_2$. A voltage supply terminal $V_H$ is connected to the source of a field effect transistor T9, which has its drain connected to node A, and to the source of a field effect transistor T10, which has its drain connected to node B. Transistor T5, T6, T7, T8, T9 and T10 are preferably of the P channel type. Transistors T1 and T2 are preferably of the N channel type and transistors T3 and T4 may be NPN transistors. $V_H$ is preferably at +5 volts.

Figure 2:
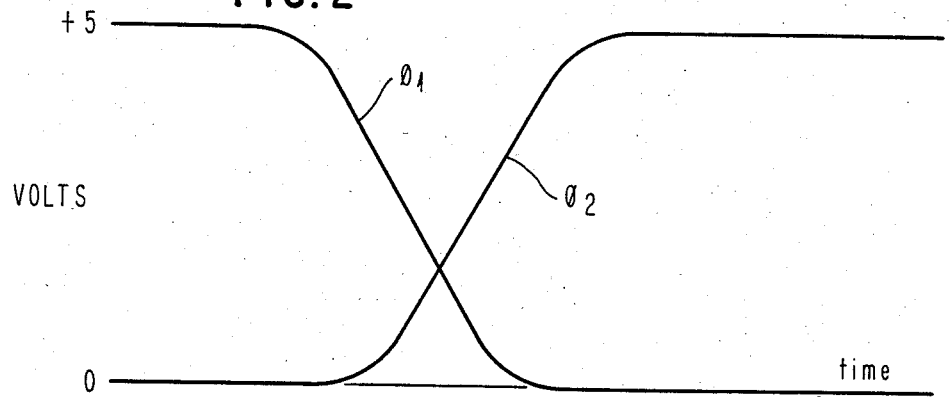
FIGS. 2 and 3 indicate voltages plotted against time which occur at various points in the circuit of FIG. 1 during the operation thereof.
Figure 3:
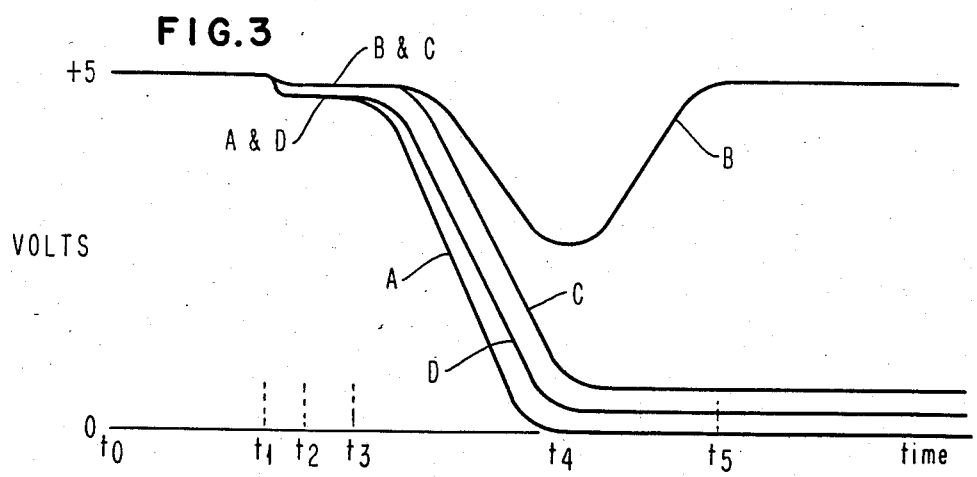

To better understand the operation of the sensing circuit illustrated in FIG. 1 of the drawings, reference may be had to the graphs or pulse program indicated in FIGS. 2 and 3 of the drawings. At time $t_0$, $\phi_1$ is high which deactivates bipolar transistors T3 and T4 and $\phi_2$ is low which tends to turn on P channel transistors T7 and T8. Prior to receiving signals from the bit lines BLL and BLR at nodes A and B, respectively, the bit lines and nodes are precharged to $V_H$ volts, i.e., +5 volts, by turning on transistors T9 and T10 for a short period of time.

Assuming that the storage capacitor $C_{S1}$ of the cell 12 is fully charged to indicate the presence of a 1 digit of binary information and that the dummy cell capacitor $C_{D1}$ of the reference voltage means 14 is discharged, at time $t_1$, a word line pulse on word line $WL_1$ and a dummy line pulse on dummy word line $WL_D$ turn on transistors T1 and T2, respectively, which slightly discharges node A while node B remains substantially fully charged. Since transistors T7 and T8 are fully on, the voltage at the base of transistor T3, i.e., at node C, is the same as the voltage at node B and the voltage at the base of transistor T4, i.e., at node D, is the same as the voltage at node A. At time $t_2$, the voltage at $\phi_1$ begins to fall whereby the transistors T3 and T4 tend to turn on. Since the voltage at node C is higher than the voltage at node D, by time $t_3$ transistor T3 begins to turn on harder than transistor T4, resulting in a significant voltage drop at node A. It should be noted that since transistor T4 is also on at least to some extent the voltage at node B likewise drops after time $t_3$. However, since node A is dropping faster than node B, the voltage on node D rapidly decreases to a point at which transistor T4 begins to turn off. Also at time $t_3$, $\phi_2$ voltage begins to increase to turn off coupling transistors T7 and T8, thus isolating node C from node B and node D from node A except for the coupling through capacitors $C_1$ and $C_2$. Prior to time $t_4$ and after a significant voltage differential, e.g., 0.7 or more volts, has been developed between nodes A and B, the $\phi_2$ voltage has increased sufficiently to turn on transistor T6, while transistor T5 remains off due to the positive voltage applied to its gate electrode from node B. Thus, at time $t_4$ the voltage at node B begins to rise to $V_H$ or +5 volts, with the voltage at node A being at zero volts. At time $t_5$, the voltage on node B reaches +5 volts while the voltage on node A remains at zero volts.

It should be understood that the sensing circuit of this invention operates in a similar manner to that described hereinabove when the signal at node A is higher than the signal at node B. In this latter situation, transistor T4 is fully turned on along with transistor T5 to maintain node A at +5 volts and node B at ground.

It should be noted that direct current paths between terminal $V_H$ and ground exist only momentarily during transient periods.

It should also be noted that the fabrication of CMOS circuits allows for the simultaneous fabrication of bipolar transistors at little or no additional processing complexity. If a vertical transistor structure is used, the bipolar transistor will exhibit fast small signal response with very close emitter-base voltage, $V_{be}$, threshold matching, which are qualities that are highly desirable in sense amplifiers. The sensing circuit of this invention is capable of resolving very small signals of approximately 3-5 millivolts within a short period of time without the direct current power dissipation normally associated with bipolar transistor circuits. As described hereinabove, this circuit sets with only two clocks and the second clock $\phi_2$ may be triggered by the completed transient of the first clock $\phi_1$ with a CMOS inverter circuit, if desired.

Figure 4:
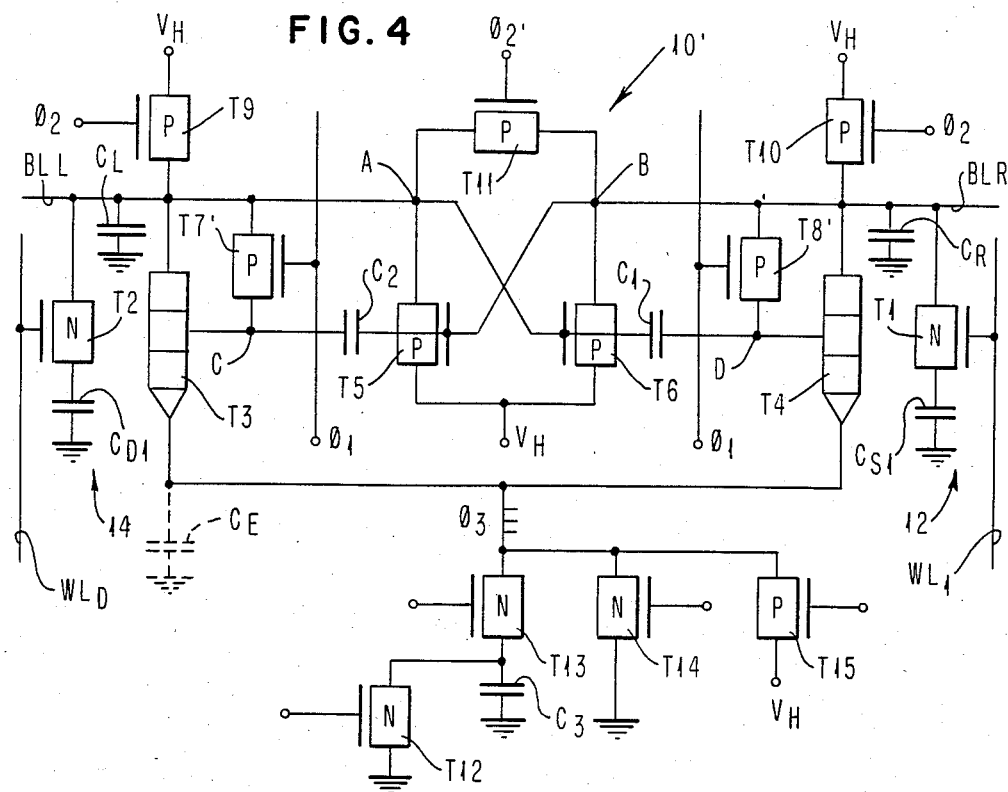
FIG. 4 illustrates another embodiment of the sensing circuit of the present invention.
Figure 5:
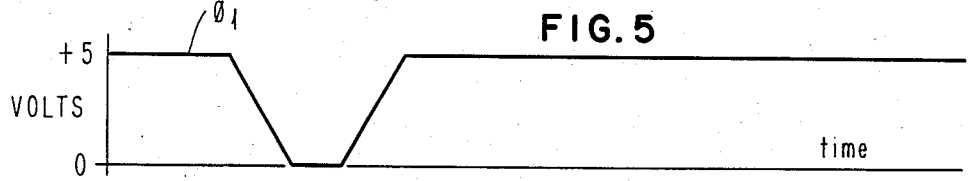
FIGS. 5, 6, 7 and 8 indicate voltages plotted against time which occur at various points in the circuit of FIG. 4 during the operation thereof and, FIGS. 9 and 10 illustrate circuits similar to those found in FIGS. 1 and 4, respectively, but wherein bipolar transistors are fabricated in the MTL or $I^2L$ technology for improved circuit density.
Figure 6:
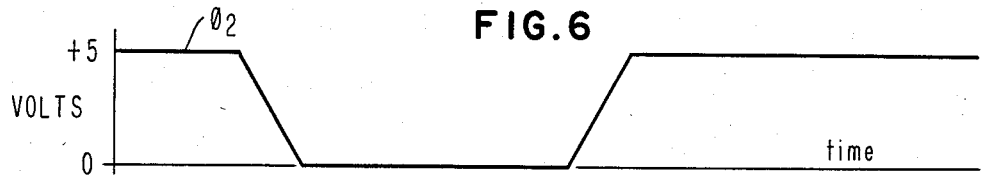
Figure 7:
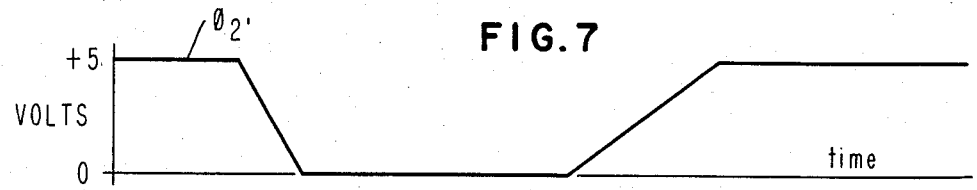
Figure 8:
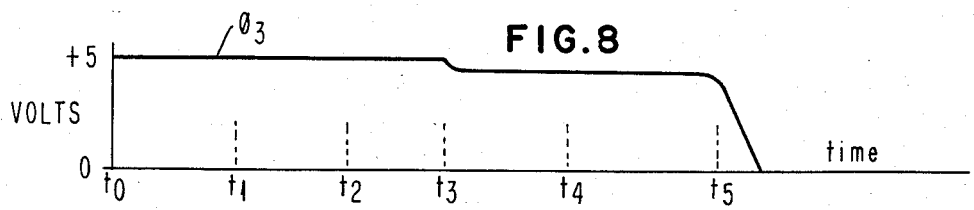

In FIG. 4 there is illustrated a second embodiment of the sensing circuit of the present invention. Elements in the circuit of FIG. 4 which are similar to the elements of FIG. 1 of the drawings are indicated by like reference characters. It should be noted that the circuit of FIG. 4 differs from the circuit of FIG. 1 primarily in that P channel field effect transistors T7' and T8' are connected between nodes A and C and B and D, respectively, under the control of a clock $\phi_1$, a voltage equalizing transistor T11 is connected between nodes A and B, under the control of a clock $\phi_{2'}$, a clock $\phi_3$ circuit is connected to the emitters of NPN bipolar transistors T3 and T4 and a clock $\phi_2$ is used to control transistors T9 and T10. The clock $\phi_3$ circuit, which may be connected to a plurality of sensing circuits, includes a capacitor $C_3$, a discharging transistor T12 connected across capacitor $C_3$, a coupling transistor T13 connected between the capacitor $C_3$ and the emitters of the NPN transistors T3 and T4, a grounding transistor T14 connected between the emitters of transistors T3 and T4 and ground and a voltage supply transistor T15 connected between the power supply terminal $V_H$ and the emitters of the transistors T3 and T4. Transistors T12, T13, and T14 are preferably N channel field effect transistors and transistor T15 is preferably a P channel field effect transistor. The wiring capacitance between the emitters of NPN transistors T3 and T4 and ground is indicated by the parasitic capacitor $C_E$. Capacitor $C_3$ preferably has a capacitance equal to one quarter of the wiring capacitance $C_E$.

To better understand the operation of the sensing circuit of FIG. 4, reference may be had to the pulse program indicated in FIGS. 5, 6, 7 and 8 of the drawings. At time $t_0$ all phases $\phi_1$, $\phi_2$, $\phi_{2'}$ and $\phi_3$ are high, $\phi_3$ being held high by turning on transistor T15 of the clock $\phi_3$ circuit. The operation of the circuit begins at time $t_1$ with the bit lines BLL and BLR being precharged to $V_H$ by turning on transistors T9 and T10 under the control of clock $\phi_2$, while coincidentally turning on transistors T7' and T8' under the control of clock $\phi_1$ to also charge nodes C and D to $V_H$. At time $t_2$, $\phi_1$ begins to return to +5 volts turning off transistors T7' and T8'. Prior to time $t_3$, transistor T12 is turned on to discharge capacitor $C_3$, and at time $t_3$ transistor T15 is turned off and coupling transistor T13 is turned on to connect the discharged capacitor $C_3$ to the emitters of transistors T3 and T4 and to wiring capacitance $C_E$. With transistors T7' and T8' off, capacitor $C_3$ discharges capacitor $C_E$ until it is one $V_{be}$ below the supply voltage $V_H$, where it is clamped by the emitter current of transistors T3 and T4 of all connected circuits 10'. This drop in voltage at the emitters, or at $\phi_3$, at time $t_3$ also causes a voltage drop at the bases of the transistors T3 and T4 of, e.g., 50±3 millivolts. The nodes C and D will not discharge larger amounts because once the bipolar transistors begin conduction the cross-coupling capacitors $C_1$ and $C_2$ appear as loads to the clock $\phi_3$ circuit amplified by the gain of the transistors. Any mismatch in $V_{be}$ between transistors T3 and T4 is reflected in the voltages across the capacitors $C_1$ and $C_2$. Thus, transistors T3 and T4 are now preconditioned to turn on with the slightest voltage increment applied to their bases. At time $t_4$, $\phi_2$ and $\phi_{2'}$ begin to increase turning off transistors T9, T10 and T11. It should be noted, however, that the rise time of $\phi_{2'}$ is longer than that of $\phi_2$ to minimize noise during the final moments of turn off. Transistor T11 is preferably smaller than transistors T9 and T10 and is designed to be highly symmetrical so as to introduce only a millivolt or less of differential noise.

By turning on transistors T1 and T2 under the control of word line $WL_1$ and dummy word line $WL_D$, respectively, between times $t_4$ and $t_5$, signals are applied to nodes A and B for amplification. At time $t_5$, $\phi_3$ is decreased toward ground by turning on transistor T14 to fully activate transistors T3 and T4. These signals are initially amplified by the bipolar transistors T3 and T4 with their own mismatch compensated by the preconditioned voltages across the capacitors $C_1$ and $C_2$. As the voltages on one of the nodes A or B drops a threshold voltage $V_{th}$ below the supply voltage $V_H$, the corresponding P channel transistor T5 or T6 automatically joins in the amplification process.

In the operation, the bipolar transistor gain need be only slightly larger than the ratio of bit line capacitance $C_L$ or $C_R$ to the cross-coupling capacitor capacitance $C_1$ or $C_2$, with ten being a desirable design number.

It can be seen that a very sensitive CMOS sense amplifier has been provided in accordance with the teachings of this invention with base-emitter voltage, $V_{be}$, matching. Also, this circuit may be made with shallow device junctions to provide high speed with the NPN bipolar transistors typically fabricated in the N-well created for P channel field effect transistors in CMOS circuits.

As can be understood from the hereinabove teachings of this invention, a sensing circuit has been provided that has better sensitivity than normally found in either N channel field effect transistor or bipolar transistor sense amplifiers, has little or no direct current power dissipation, has no bit line droop and has rapid latching action.

Figure 9:
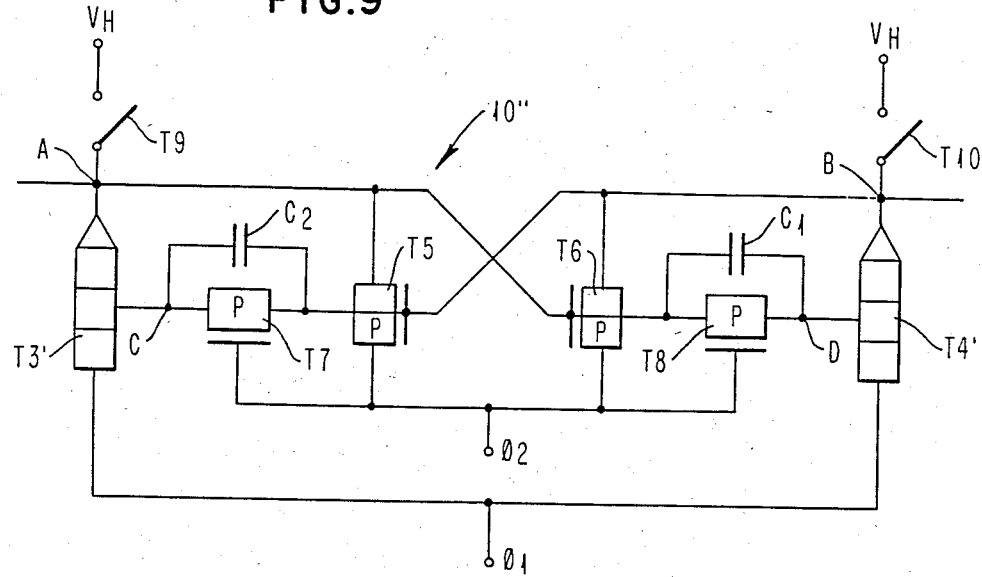
Figure 10:
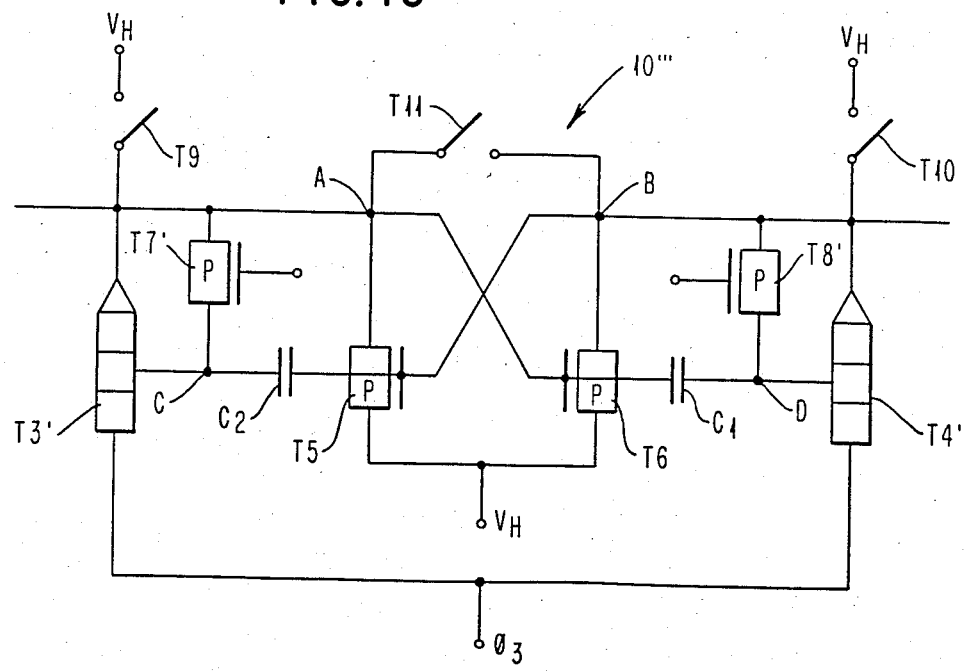

More dense bipolar P channel field effect transistor sense amplifiers may be made in accordance with the further teachings of this invention by using bipolar transistors fabricated in the merged transistor logic, MTL, or integrated injection logic, $I^2L$, technology as indicated in FIGS. 9 and 10 of the drawings by transistors T3' and T4'. The operation of the sensing circuits illustrated in FIGS. 9 and 10 is essentially the same as that described hereinabove in connection with the sensing circuits illustrated in FIGS. 1 and 4, respectively, of the drawings. Since MTL bipolar transistors have a lower beta and lower frequency response, the value of the coupling capacitors $C_1$ and $C_2$ and the ramp speed of clocks $\phi_1$ and $\phi_3$ in the circuits of FIGS. 9 and 10, respectively, may have to be adjusted accordingly for optimum operation.

It can be seen that in accordance with the teachings of this invention, a sensing circuit is provided for CMOS technology which uses a bipolar precharge to cut-off and stored offset concept for making a very sensitive amplifier and a pair of cross-coupled bipolar transistors is used as a preamplifier to generate sufficient offset to set a P channel latch to provide improved performance over known field effect transistor sense amplifiers, while using low power. Furthermore, this sense amplifier sets to a full supply voltage $V_H$, or +5, volts and ground.

While the invention has been particularly shown and described with reference to preferred embodiments thereof, it will be understood by those skilled in the art that various changes in form and details may be made therein without departing from the spirit and scope of the invention.

What is claimed is:

1. A sense amplifier comprising;
first and second nodes,
input/output means coupled to said nodes,
a pair of cross-coupled bipolar transistors arranged as a regenerative latch coupled at their control electrodes between said nodes,
a pair of cross-coupled field effect transistors arranged as regenerative latch coupled at their control electrodes between said nodes, and
means for coupling a supply voltage to said transistors.

2. A sense amplifier as set forth in claim 1 further including first and second impedance means, said first impedance means being connected between the control terminal of one of said bipolar transistors and the control terminal of one of said field effect transistors and said second impedance means being connected between the control terminal of the other of said bipolar transistors and the control terminal of the other of said field effect transistors.

3. A sense amplifier as set forth in claim 2 wherein each of said impedance means includes a capacitor.

4. A sense amplifier as set forth in claim 3 further including a first additional field effect transistor connected between the base of said one bipolar transistor and one of said first and second nodes and a second additional field effect transistor connected between the base of said other bipolar transistor and the other of said first and second nodes, said first and second additional transistors being controlled by a clock pulse.

5. A sense amplifier as set forth in claim 3 further including means coupled to the emitters of said bipolar transistors for compensating for base-emitter mismatch of said pair of bipolar transistors by producing voltage differences across said capacitors.

6. A sense amplifier as set forth in claim 5 wherein said compensating means includes means for decreasing the voltage at the emitters of said bipolar transistors.

7. A sense amplifier as set forth in claim 2 wherein said first impedance means includes a first P channel field effect transistor connected between said first node and the base of one of said pair of bipolar transistors and said second impedance means includes a second P channel field effect transistor connected between second node and the base of the other of said pair of bipolar transistors, the control gates of said first and second P channel transistors being connected to a clock pulse terminal.

8. A sense amplifier as set forth in claim 1 wherein each of said field effect transistors is a P channel transistor.

9. A sense amplifier as set forth in claim 1 further including means for precharging said first and second nodes to a common potential during a first period of time and means for applying signals to said nodes during a second period of time.

10. A sense amplifier as set forth in claim 9 wherein said precharging means includes a voltage equalizing transistor connected between said first and second nodes.

11. A sense amplifier as set forth in claim 9 wherein said precharging means includes first and second P channel transistors connected to said first and second nodes, respectively.

12. A sense amplifier as set forth in claim 11 wherein said precharging means further includes a third P channel transistor connected between said first and second nodes and means for turning off said third transistor at a slower rate than the turn off rate of said first and second transistors.

13. A sense amplifier as set forth in claim 1 wherein said bipolar transistors are NPN transistors and said field effect transistors are P channel transistors.

14. A sense amplifier as set forth in claim 1 further including means for activating said bipolar transistors during a first period of time and means for activating said field effect transistors during a second period of time.

15. A sensing circuit comprising;
first and second nodes,
means for charging said nodes to a common voltage during a first period of time,
a first clock pulse terminal,
a first bipolar transistor connected between said first node and said first terminal,
a second bipolar transistor connected between said second node and said first terminal,
a first capacitor connected between said first node and the base of said second bipolar transistor,
a second capacitor connected between said second node and the base of said first bipolar transistor,
a second clock pulse terminal,
a first P channel field effect transistor connected between said first node and said second terminal, the control gate of said first P channel transistor being connected to said second node,
a second P channel field effect transistor connected between said second node and said second terminal, the control gate of said second P channel transistor being connected to said first node, and
third and fourth P channel field effect transistors connected across said first and second capacitors, respectively, the control gates of said third and fourth P channel transistors being connected to said second terminal.

16. A sensing circuit as set forth in claim 15 wherein said bipolar transistors are NPN transistors.

17. A sensing circuit as set forth in claim 15 wherein the collector and emitter of said first bipolar transistor are connected to said first node and said first clock pulse terminal, respectively, and the collector and emitter of said second bipolar transistor are connected to said second node and said first clock pulse terminal, respectively.

18. A sensing circuit as set forth in claim 15 wherein the collector and emitter of said first bipolar transistor are connected to said first clock pulse terminal and said first node, respectively, and the collector and emitter of said second bipolar transistor are connected to said first clock pulse terminal and said second node, respectively.

19. A sensing circuit comprising;
first and second nodes,
means for charging said nodes to a common voltage,
a first clock pulse terminal,
a first bipolar transistor connected between said first node and said first terminal,
a second bipolar transistor connected between said second node and said first terminal,
a first capacitor connected between said first node and the base of said second bipolar transistor,
a second capacitor connected between said second node and the base of said first bipolar transistor,
a supply voltage terminal,
a first P channel field effect transistor connected between said first node and said supply voltage terminal, the control gate of said first P channel transistor being connected to said second node,
a second P channel field effect transistor connected between said second node and said supply voltage terminal, the control gate of said second P channel transistor being connected to said first node,
a second clock pulse terminal,
a third P channel field effect transistor connected between said first node and the base of said first bipolar transistor, the control gate of said third P channel transistor being connected to said second terminal, and a fourth P channel field effect transistor connected between said second node and the base of said second bipolar transistor, the control gate of said fourth P channel transistor being connected to said second terminal.

20. A sensing circuit as set forth in claim 19 wherein said bipolar transistors are NPN transistors.

21. A sensing circuit as set forth in claim 19 further including a clock pulse circuit connected to said first clock pulse terminal, said clock pulse circuit including a third capacitor, means for discharging said third capacitor, means for selectively connecting said third capacitor to said first clock pulse terminal, means for selectively connecting said supply voltage terminal to said first clock pulse terminal and means for selectively connecting said first clock pulse terminal to a point of reference potential.

22. A sensing circuit as set forth in claim 19 wherein the collector and emitter of said first bipolar transistor are connected to said first node and said first clock pulse terminal, respectively, and the collector and emitter of said second bipolar transistor are connected to said second node and said first clock pulse terminal, respectively.

23. A sensing circuit as set forth in claim 19 wherein the collector and emitter of said first bipolar transistor are connected to said first clock pulse terminal and said first node, respectively, and the collector and emitter of said second bipolar transistor are connected to said first clock pulse terminal and said second node, respectively.

* * * * *